United States Patent
Chindo

(10) Patent No.: US 9,356,426 B2
(45) Date of Patent: May 31, 2016

(54) ELECTRONIC DEVICE, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Koji Chindo, Suwa (JP)

(73) Assignee: Seiko Epson Corporation (JP)

(*) Notice: Subject to any disclaimer, the term of this patent is extended or adjusted under 35 U.S.C. 154(b) by 135 days.

(21) Appl. No.: 14/219,102

(22) Filed: Mar. 19, 2014

(65) Prior Publication Data

US 2014/0293551 A1    Oct. 2, 2014

(30) Foreign Application Priority Data

Mar. 27, 2013  (JP) ................................. 2013-066357

(51) Int. Cl.
*H03B 17/00*   (2006.01)
*H03L 1/04*   (2006.01)
*H03L 7/26*   (2006.01)
*H01S 5/0687*   (2006.01)
*G04F 5/14*   (2006.01)
*H01S 5/02*   (2006.01)
*H01S 5/022*   (2006.01)
*H01S 5/024*   (2006.01)
*H01S 5/183*   (2006.01)

(52) U.S. Cl.
CPC ............... *H01S 5/0687* (2013.01); *G04F 5/145* (2013.01); *H03B 17/00* (2013.01); *H03L 1/04* (2013.01); *H03L 7/26* (2013.01); *H01S 5/02* (2013.01); *H01S 5/02212* (2013.01); *H01S 5/02446* (2013.01); *H01S 5/183* (2013.01)

(58) Field of Classification Search
CPC ........... G04F 5/14; G04F 5/145; H03B 17/00; H03L 1/02; H03L 1/04; H03L 7/26

USPC .......................................... 331/3, 68–70, 94.1
See application file for complete search history.

(56) References Cited

U.S. PATENT DOCUMENTS

| | | | | | |
|---|---|---|---|---|---|
| 3,382,452 | A | * | 5/1968 | Rempel | H03L 7/26 331/3 |
| 4,128,814 | A | * | 12/1978 | Frosch | H01S 1/06 324/307 |
| 5,387,881 | A | | 2/1995 | Schweda et al. | |
| 5,801,590 | A | * | 9/1998 | Kashima | H03B 5/1876 331/117 D |
| 6,201,449 | B1 | * | 3/2001 | Korber, Jr. | H03B 5/1882 331/108 D |
| 6,778,029 | B2 | * | 8/2004 | Mizusawa | H03B 5/36 310/348 |
| 7,049,897 | B2 | * | 5/2006 | Haruta | H03B 5/187 331/107 DP |
| 7,952,440 | B2 | * | 5/2011 | Murase | H03H 9/1021 310/348 |

(Continued)

FOREIGN PATENT DOCUMENTS

| | | |
|---|---|---|
| JP | 57-155810 | 9/1982 |
| JP | 06-104507 | 4/1994 |

(Continued)

*Primary Examiner* — Levi Gannon
(74) *Attorney, Agent, or Firm* — Harness, Dickey & Pierce, P.L.C.

(57) ABSTRACT

An atomic oscillator includes a first unit and a second unit arranged to be separated from each other and a package including an internal space in which the first unit and the second unit are housed in a state in which the internal space is decompressed to pressure lower than the atmospheric pressure. The reflectance of the outer surfaces of the first unit and the second unit to an electromagnetic wave having a wavelength of 4 μm is equal to or higher than 50%.

9 Claims, 8 Drawing Sheets

(56) References Cited

U.S. PATENT DOCUMENTS

2007/0247241 A1* 10/2007 Braun .................. G04F 5/14
 331/94.1
2010/0102893 A1 4/2010 Chindo et al.
2012/0212298 A1* 8/2012 Lecomte ............... G04F 5/14
 331/94.1

FOREIGN PATENT DOCUMENTS

| JP | 2010-109525 A | 5/2010 |
| JP | 2011-192933 A | 9/2011 |
| JP | 2012-191523 A | 10/2012 |
| JP | 2012-195351 A | 10/2012 |
| JP | 2012-195788 A | 10/2012 |

* cited by examiner

ELECTRONIC DEVICE, QUANTUM INTERFERENCE DEVICE, ATOMIC OSCILLATOR, ELECTRONIC APPARATUS, AND MOVING OBJECT

BACKGROUND

1. Technical Field

The present invention relates to an electronic device, a quantum interference device, an atomic oscillator, an electronic apparatus, and a moving object.

2. Related Art

In an electronic device in which an electronic component subjected to temperature control is housed in a package, it is generally performed to evacuate the package for the purpose of preventing heat conduction from the outside of the package to the electronic component in the package.

For example, an electronic device disclosed in JP-UM-A-57-155810 (Patent Literature 1), a container (an electronic component) on the inner side, in which a crystal oscillation circuit, a heat generating element, and a thermosensitive element are housed, is housed in another container (a package) on the outer side and a space between the containers is evacuated.

However, in the electronic device disclosed in Patent Literature 1, although heat conduction and transfer of heat by convection between the electronic component and the package can be reduced, the temperature of the electronic component fluctuates because of transfer of heat by radiation from the package to the electronic component.

Further, in the electronic device disclosed in Patent Literature 1, when two electronic components subjected to temperature control at temperatures different from each other are housed in the package, the temperatures of the electronic components fluctuate because of transfer of heat by radiation between the two electronic components.

These problems are conspicuous when the distances between the package and the electronic components and the distance between the two electronic components in the package decrease according to a reduction in the size of the electronic device.

Examples of the device in which the two electronic components subjected to temperature control at temperatures different from each other are housed in the package include an atomic oscillator that oscillates on the basis of energy transfer of atoms of alkali metal such as rubidium or cesium. In the atomic oscillator, in general, a package houses a gas cell having alkali metal encapsulated therein together with a buffer gas, a light emitting section configured to emit excitation light for exciting the alkali metal in the gas cell, and a light detecting section configured to detect the excitation light transmitted through the gas cell. It is necessary to maintain the light emitting section and the gas cell at fixed temperatures different from each other in order to display a stable oscillation characteristic.

SUMMARY

An advantage of some aspects of the invention is to provide an electronic device that can suppress temperature fluctuation of each of two electronic components in a package while realizing a reduction in size, provide a quantum interference device and an atomic oscillator that can suppress temperature fluctuation of each of a light emitting section and a gas cell in a package while realizing a reduction in size, and further provide an electronic apparatus and a moving object including the atomic oscillator.

The invention can be implemented as the following forms and application examples.

Application Example 1

An electronic device according to this application example includes: a first electronic component and a second electronic component; and a package including an internal space in which the first electronic component and the second electronic component are housed to be separated from each other in a state in which the internal space is decompressed to pressure lower than the atmospheric pressure. The reflectance of at least a part of the outer surface of at least one electronic component of the first electronic component and the second electronic component to an electromagnetic wave having a wavelength of 4 μm is equal to or higher than 50%.

In the electronic device, the first electronic component and the second electronic component are arranged in the internal space of the package while being separated from each other. The internal space of the package has the pressure lower than the atmospheric pressure. Therefore, it is possible to suppress heat conduction and transfer of heat by convection between the package and the first and second electronic components and between the first electronic component and the second electronic component.

Further, heat radiated from the package is reflected on the outer surface of the first electronic component or the second electronic component. Therefore, even if a reduction in the size of the package is realized, it is possible to suppress transfer of heat from the outside of the package to the first electronic component or the second electronic component.

Heat radiated from one electronic component of the first electronic component and the second electronic component is reflected on the other electronic component. Therefore, even if the distance between the first electronic component and the second electronic component is reduced, it is possible to suppress transfer of heat from the one electronic component to the other electronic component.

Consequently, it is possible to suppress temperature fluctuation of each of the two electronic components in the package while realizing a reduction in size.

Application Example 2

In the electronic device according to this application example, it is preferable that the first electronic component is subjected to temperature control at a first temperature, and the second electronic component is subjected to temperature control at a second temperature higher than the first temperature.

In this case, a problem due to transfer of heat by radiation between the package and the first and second electronic components and between the first electronic component and the second electronic component becomes conspicuous. Therefore, in this case, an effect by this application example conspicuously appears.

Application Example 3

In the electronic device according to this application example, it is preferable that the inner surface of the package includes a black or dark color portion.

Consequently, heat radiated from the first electronic component and the second electronic component is absorbed by the internal surface of the package. Therefore, it is possible to suppress heat radiated from one electronic component of the first electronic component and the second electronic component from being reflected on the inner surface of the package and transferred to the other electronic component.

Application Example 4

In the electronic device according to this application example, it is preferable that the reflectance of at least a part of the outer surface of the package to the electromagnetic wave having the wavelength of 4 μm is equal to or higher than 50%.

Consequently, heat from the outside of the package is reflected on the outer surface of the package. Therefore, it is possible to suppress heat from the outside of the package from being transferred in the package.

Application Example 5

In the electronic device according to this application example, it is preferable that the reflectance of at least a part of the outer surface of each of the first electronic component and the second electronic component to the electromagnetic wave having the wavelength of 4 μm is equal to or higher than 50%.

Consequently, it is possible to more effectively suppress transfer of heat by radiation between the first electronic component and the second electronic component.

Application Example 6

In the electronic device according to this application example, it is preferable that a metal film is arranged on the outer surface of at least one electronic component of the first electronic component and the second electronic component.

Consequently, it is possible to set the reflectance of a part where the metal film is provided to the electromagnetic wave having the wavelength of 4 μm to be equal to or higher than 75%.

Application Example 7

A quantum interference device according to this application example includes the electronic device according to the application example described above, the first electronic component includes a light emitting section configured to emit light, and the second electronic component includes a gas cell having metal atoms excited by the light encapsulated therein.

With the quantum interference device, it is possible to suppress temperature fluctuation of each of the light emitting section and the gas cell in the package while realizing a reduction in size.

Application Example 8

An atomic oscillator according to this application example includes the electronic device according to the application example described above.

With the atomic oscillator, it is possible to suppress temperature fluctuation of each of a light emitting section and a gas cell in the package while realizing a reduction in size.

Application Example 9

An electronic apparatus according to this application example includes the electronic device according to the application example described above.

The electronic apparatus has excellent reliability.

Application Example 10

A moving object according to this application example includes the electronic device according to the application example described above.

The moving object has excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

An electronic device, a quantum interference device, an atomic oscillator, an electronic apparatus, and a moving object according to the invention are explained in detail below with reference to an embodiment shown in the accompanying drawings.

1. Atomic Oscillator (Quantum Interference Device)

First, the atomic oscillator according to the invention (the atomic oscillator including the quantum interference device according to the invention) is explained. In the following explanation, an example in which the quantum interference device according to the invention is applied to the atomic oscillator is explained. However, the quantum interference device according to the invention is not limited to this. The quantum interference device according to the invention can also be applied to, for example, a magnetic sensor and a quantum memory besides the atomic oscillator.

Figure 1:
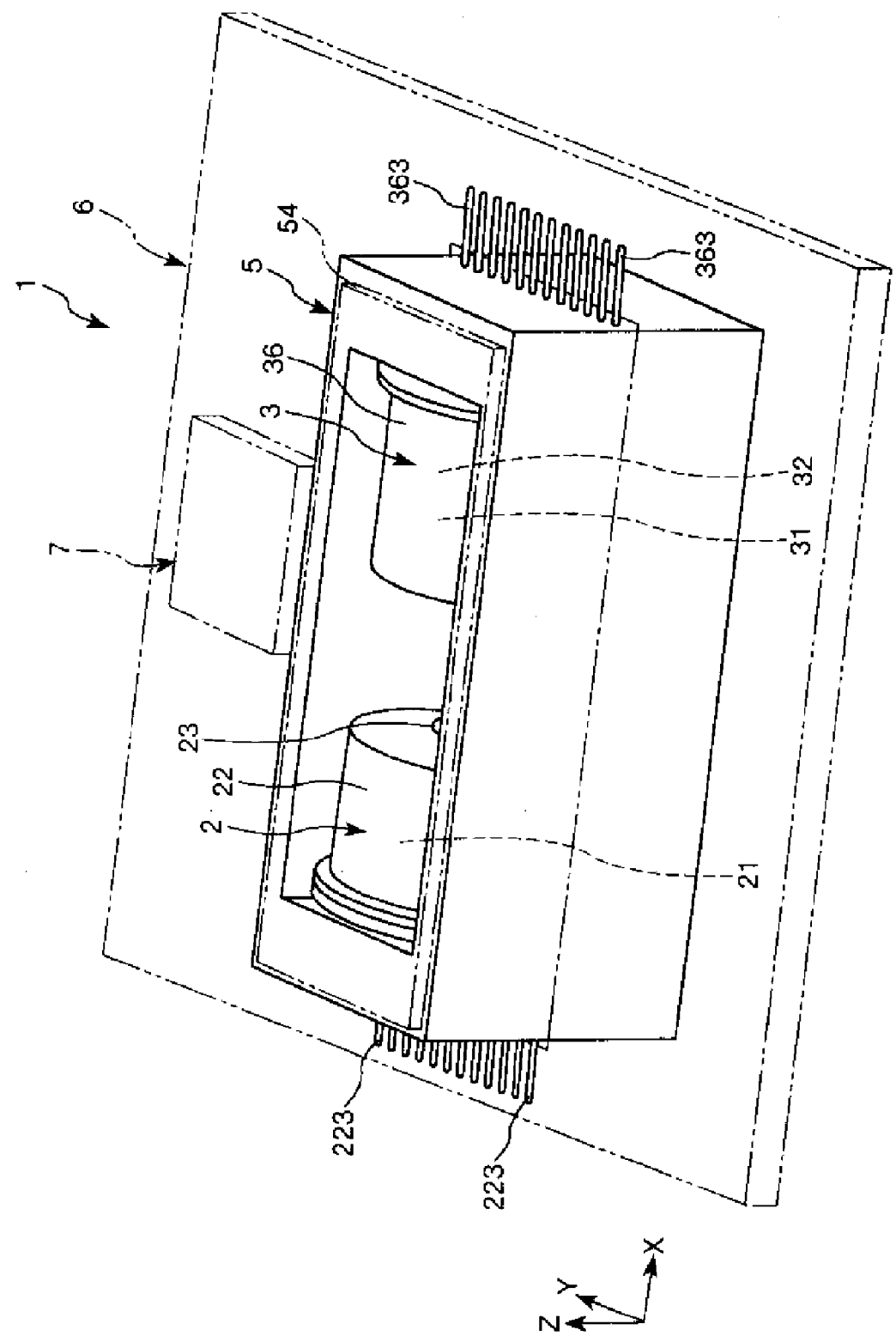
FIG. 1 is a perspective view showing an atomic oscillator according to an embodiment of the invention.
Figure 2:
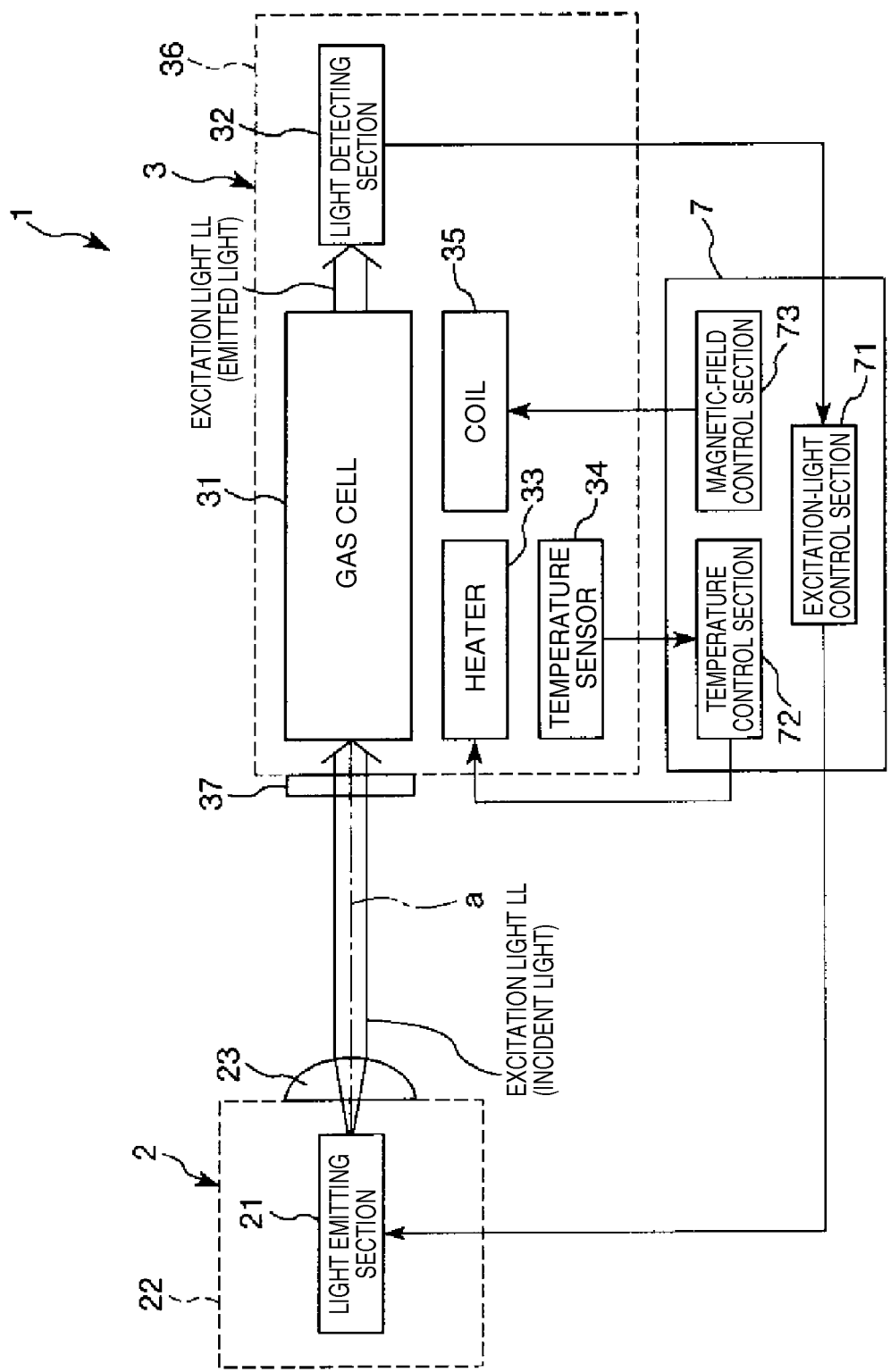
FIG. 2 is a schematic diagram showing the schematic configuration of the atomic oscillator shown in FIG. 1.
Figure 3:
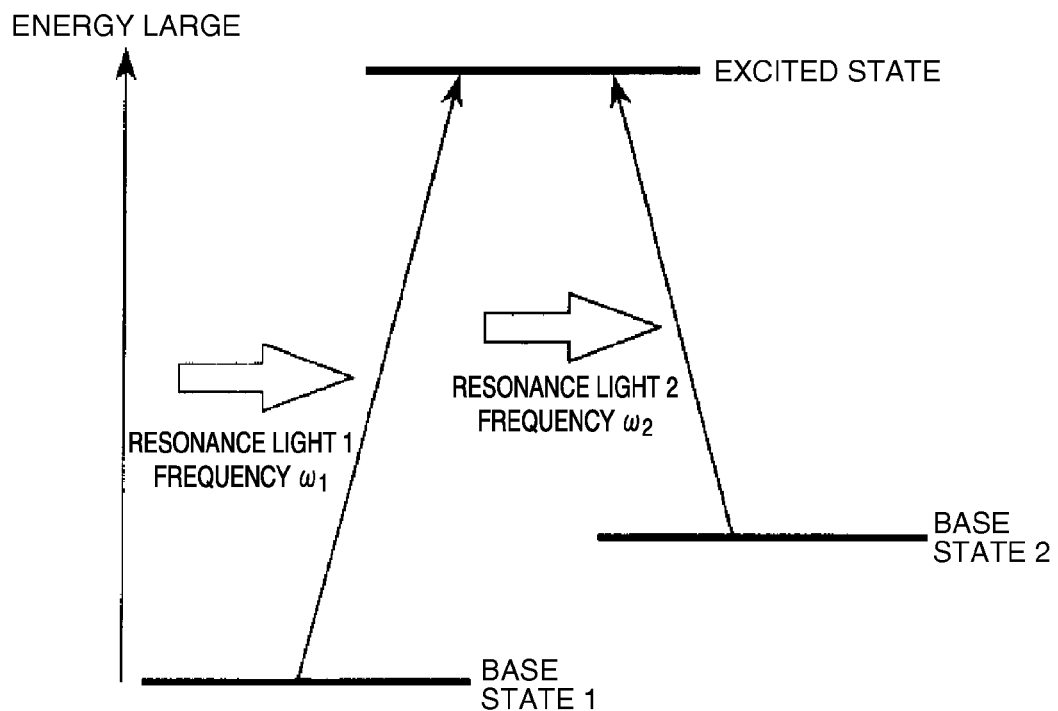
FIG. 3 is a diagram for explaining an energy state of alkali metal in a gas cell included in the atomic oscillator shown in FIG. 1.
Figure 4:
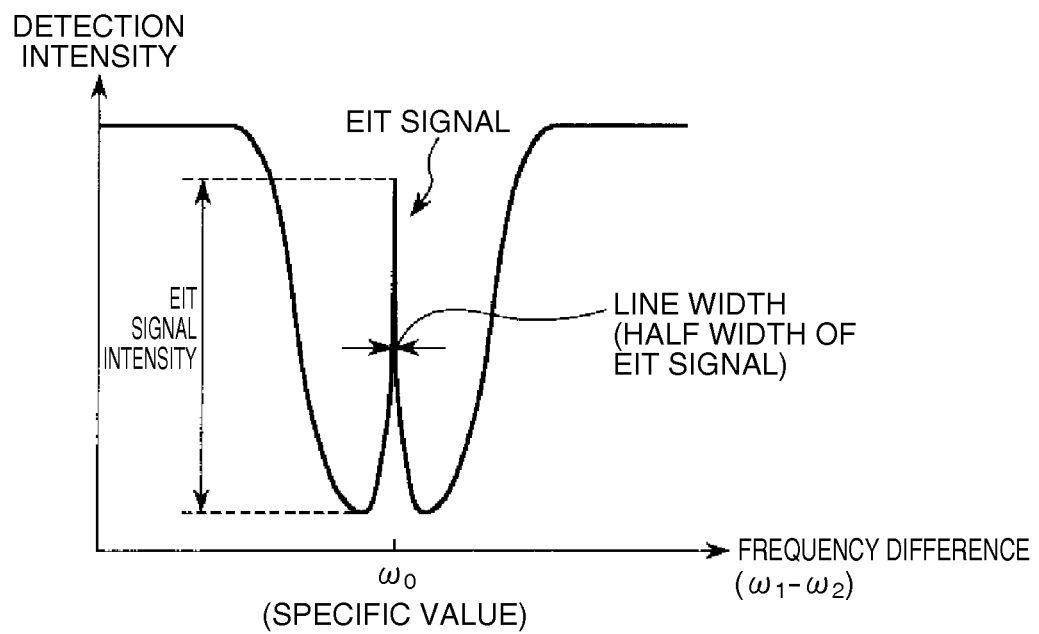
FIG. 4 is a graph showing, concerning a light emitting section and a light detecting section included in the atomic oscillator shown in FIG. 1, a relation between a frequency difference between two lights emitted from the light emitting section and detection intensity in the light detecting section.
Figure 5:
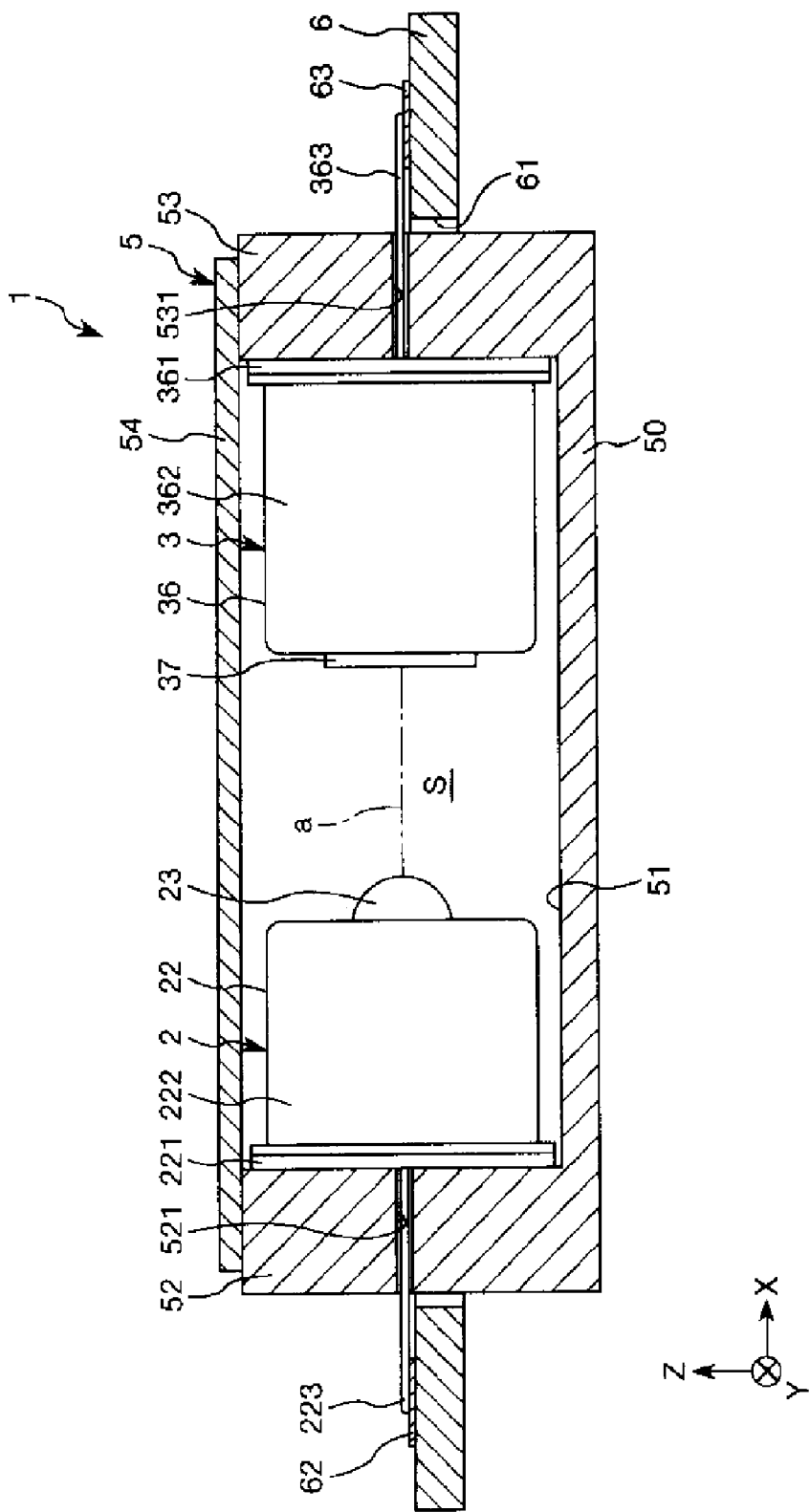
FIG. 5 is a longitudinal sectional view of the atomic oscillator shown in FIG. 1.
Figure 6:
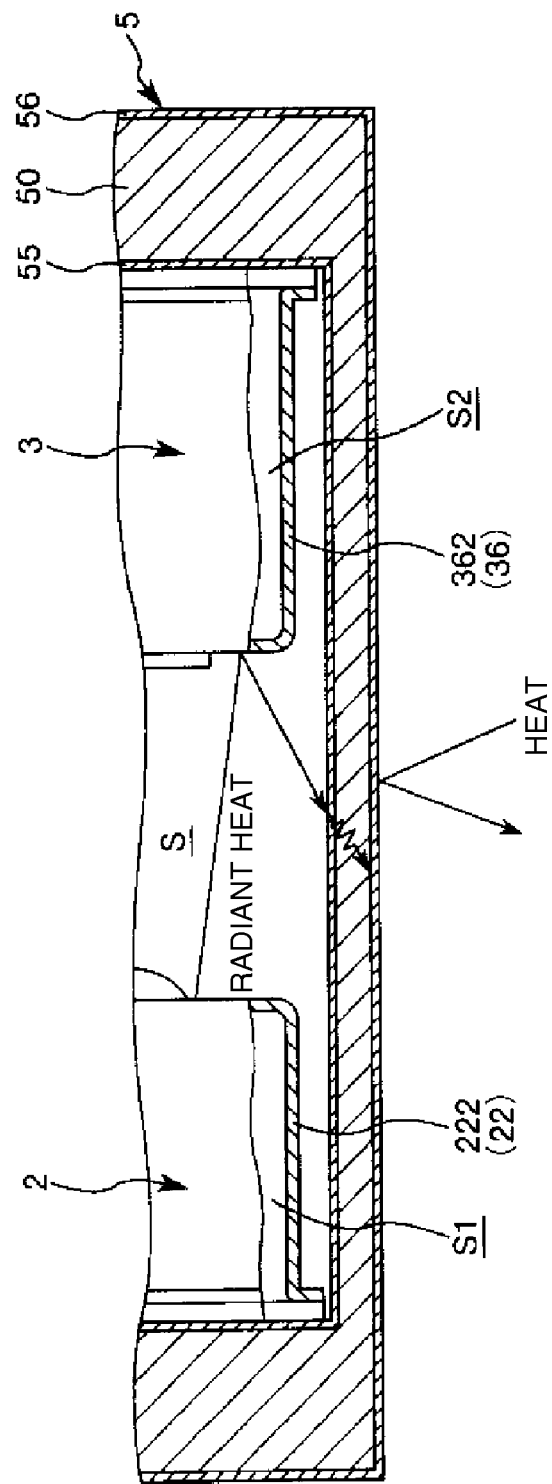
FIG. 6 is a diagram for explaining the action of the atomic oscillator shown in FIG. 1.

FIG. 1 is a perspective view showing an atomic oscillator according to an embodiment of the invention. FIG. 2 is a schematic diagram showing the schematic configuration of the atomic oscillator shown in FIG. 1. FIG. 3 is a diagram for explaining an energy state of alkali metal in a gas cell included in the atomic oscillator shown in FIG. 1. FIG. 4 is a graph showing, concerning a light emitting section and a light detecting section included in the atomic oscillator shown in FIG. 1, a relation between a frequency difference between two lights emitted from the light emitting section and detection intensity in the light detecting section. FIG. 5 is a longitudinal sectional view of the atomic oscillator shown in FIG. 1. FIG. 6 is a diagram for explaining the action of the atomic oscillator shown in FIG. 1.

In FIGS. 1 and 5, for convenience of explanation, an X axis, a Y axis, and a Z axis are shown as three axes orthogonal to one another. The distal end side of arrows of the axes shown in the figure is represented as "+ (plus)" and the proximal end side of the arrows is represented as "– (minus)". In the following explanation, for convenience of explanation, a direction parallel to the X axis is referred to as "X-axis direction", a direction parallel to the Y axis is referred to as "Y-axis direction", and a direction parallel to the Z axis is referred to as "Z-axis direction". The +Z-direction side (the upper side in FIG. 5) is referred to as "up" and the −Z-direction side (the lower side in FIG. 5) is referred to as "down".

An atomic oscillator 1 shown in FIG. 1 is an atomic oscillator that makes use of a quantum interference effect.

The atomic oscillator 1 includes, as shown in FIG. 1, a first unit 2 (a light emission side unit) functioning as a first electronic component, a second unit 3 (a light detection side unit) functioning as a second electronic component, a package 5 configured to house the foregoing, a wiring board 6 (a board) configured to support the package 5, and a control section 7 mounted on the wiring board 6.

The first unit 2 includes, as shown in FIGS. 1 and 2, a light emitting section 21 and a first package 22 (a light emission side package) configured to house the light emitting section 21.

The second unit 3 includes a gas cell 31, a light detecting section 32, a heater 33, a temperature sensor 34, a coil 35, and a second package 36 (a light detection side package) configured to house the foregoing.

The first unit 2 and the second unit 3 are electrically connected to the control section 7 via a wire (not shown in the figure) of the wiring board 6 and controlled to be driven by the control section 7.

First, the principle of the atomic oscillator 1 is briefly explained.

In the atomic oscillator 1, alkali metal (metal atoms) such as gaseous rubidium, cesium, or sodium is encapsulated in the gas cell 31.

As shown in FIG. 3, the alkali metal has energy levels of a three level system and can take three states, i.e., two base states (base states 1 and 2) having different energy levels and an excited state. The base state 1 is an energy state lower than the base state 2.

When two kinds of resonance lights 1 and 2 having different frequencies are irradiated on the gaseous alkali metal explained above, light absorption rates (light transmittances) of the resonance lights 1 and 2 in the alkali metal change according to a difference ($\omega 1 - \omega 2$) between a frequency $\omega 1$ of the resonance light 1 and a frequency $\omega 2$ of the resonance light 2.

When the difference ($\omega 1 - \omega 2$) between the frequency $\omega 1$ of the resonance light 1 and the frequency $\omega 2$ of the resonance light 2 coincides with a frequency equivalent to an energy difference between the base state 1 and the base state 2, excitations from the base states 1 and 2 to the excited state respectively stop. At this point, both of the resonance lights 1 and 2 are transmitted without being absorbed by the alkali metal. Such a phenomenon is called CPT phenomenon or an electromagnetically induced transparency (EIT) phenomenon.

The light emitting section 21 emits the two kinds of lights (the resonance light 1 and the resonance light 2) having the different frequencies to the gas cell 31.

For example, the light emitting section 21 fixes the frequency $\omega 1$ of the resonance light 1 and changes the frequency $\omega 2$ of the resonance light 2. Then, when the difference ($\omega 1 - \omega 2$) between the frequency $\omega 1$ of the resonance light 1 and the frequency $\omega 2$ of the resonance light 2 coincides with a frequency $\omega 0$ equivalent to the energy difference between the base state 1 and the base state 2, the detection intensity of the light detecting section 32 steeply rises as shown in FIG. 4. The light detecting section 32 detects a signal of such a steep rise as an EIT signal. The EIT signal has an eigenvalue determined by a type of the alkali metal. Therefore, it is possible to realize a highly accurate oscillator by using such an EIT signal as a reference.

The sections of the atomic oscillator 1 are explained in detail below in order.

First Unit

As explained above, the first unit 2 (the first electronic component) includes the light emitting section 21 and the first package 22 configured to house the light emitting section 21.

Light Emitting Section

The light emitting section 21 has a function of emitting excitation light for exciting alkali metal atoms in the gas cell 31.

More specifically, the light emitting section 21 emits two kinds of lights (the resonance light 1 and the resonance light 2) having the different frequencies.

The frequency $\omega 1$ of the resonance light 1 can excite the alkali metal in the gas cell 31 from the base state 1 to the excited state.

The frequency $\omega 2$ of the resonance light 2 can excite the alkali metal in the gas cell 31 from the base state 2 to the excited state.

The light emitting section 21 is not particularly limited as long as the light emitting section 21 can emit the excitation light. For example, a semiconductor laser such as a vertical cavity surface emitting laser (VCSEL) can be used.

The light emitting section 21 is subjected to temperature control to temperature (a first temperature) different from the temperature of the gas cell 31, for example, about 30° C. by a not-shown temperature control element (a heat generating resistor, a Peltier element, etc.).

First Package (Light Emission Side Package)

The first package 22 houses the light emitting section 21.

The first package 22 includes, as shown in FIG. 5, a base 221 (a light emission side base) and a lid body 222 (a light emission side lid body).

The base 221 directly or indirectly supports the light emitting section 21. In this embodiment, the base 221 is formed in a tabular shape and formed in a circular shape in plan view.

The light emitting section 21 (a mounted component) is set (mounted) on one surface (a mounting surface) of the base 221. On the other surface of the base 221, as shown in FIG. 5, a plurality of terminals 223 (leads) project in the −X-axis direction. The plurality of terminals 223 are electrically connected to the light emitting section 21 via a not-shown wire.

As shown in FIG. 5, the plurality of terminals 223 extend in the X-axis direction and are arranged in one direction (in this embodiment, the Y-axis direction) to be parallel to one another.

A constituent material of the base 221 is not particularly limited. For example, a ceramics material, a metal material, a resin material, and the like can be used. However, it is preferable to use the metal material. Consequently, when the lid body 222 is formed of the metal material, the base 221 and the lid body 222 can be relatively easily and surely hermetically joined by welding.

The lid body 222, which covers the light emitting section 21 on the base 221, is joined to the base 221.

The lid body 222 is formed in a bottomed tubular shape opening at one end. In this embodiment, a tubular portion of the lid body 222 is formed in a cylindrical shape.

The opening at one end of the lid body 222 is closed by the base 221.

A window section 23 is provided at the other end of the lid body 222, that is, a bottom section on the opposite side of the opening of the lid body 222.

The window section 23 is provided on an optical axis "a" between the gas cell 31 and the light emitting section 21. The window section 23 has transparency to the excitation light.

In this embodiment, the window section 23 is configured by a lens. Consequently, it is possible to irradiate excitation light LL on the gas cell 31 without waste.

The window section 23 has a function of changing the excitation light LL to parallel light. Consequently, it is possible to simply and surely prevent the excitation light LL from being reflected on the inner wall of the gas cell 31. Therefore, it is possible to suitably cause resonance of the excitation light in the gas cell 31 and, as a result, improve an oscillation characteristic of the atomic oscillator 1.

The window section 23 is not limited to the lens and may be an optical component other than the lens such as a polarizing plate, a λ/4 wave plate, or a dimmer filter or may be a tabular member having simple optical transparency as long as the optical component has transparency to the excitation light. The optical components only have to be provided between the light emitting section 21 and the gas cell 31. For example, the optical components may be provided between a window section 37 and the light emitting section 21 or may be provided between the first package 22 and the second package 36.

The reflectance of the outer surface (a portion excluding the window section 23) of the lid body 222 to an electromagnetic wave having a wavelength of 4 μm (i.e., a far-infrared ray) is equal to or higher than 50%. Consequently, heat radiated from the package 5 is reflected on the outer surface of the lid body 222 (the outer surface of the first electronic component). Therefore, even if a reduction in the size of the package 5 is realized, it is possible to suppress transfer of heat from the outside of the package 5 to the lid body 222.

Heat radiated from the second unit 3 is reflected on the outer surface of the lid body 222. Therefore, even if the distance between the first unit 2 and the second unit 3 is reduced, it is possible to suppress transfer of heat from the second unit 3 to the first unit 2.

Consequently, it is possible to highly accurately subject an internal space S1 (see FIG. 6) of the first package 22 to temperature control.

The effect explained above is improved as the reflectance of the outer surface of the lid body 222 to the electromagnetic wave having the wavelength of 4 μm (hereinafter also referred to as "heat reflectance") is higher. Therefore, the reflectance is preferably equal to or higher than 75%, more preferably equal to or higher than 90%, and most preferably equal to or higher than 95%.

A constituent material of a portion other than the window section 23 of the lid body 222 is not particularly limited. For example, a ceramics material, a metal material, and a resin material can be used. However, the metal material is preferably used. Consequently, it is possible to set the heat reflectance of the outer surface of the lid body 222 to be equal to or higher than 75%. When the base 221 is formed of the metal material, the base 221 and the lid body 222 can be relatively easily and surely hermetically joined by welding.

The metal material forming the lid body 222 is not particularly limited. For example, metal such as copper (heat reflectance is 97.93%), silver (heat reflectance is 98.47%), gold (heat reflectance is 98.62%), titanium (heat reflectance is 78.04%), chrome (heat reflectance is 93.77%), iron (heat reflectance is 87.09%), cobalt (heat reflectance is 87.75%), nickel (heat reflectance is 92.38%), aluminum (heat reflectance is 99.03%), iridium (heat reflectance is 98.73%), and lead (heat reflectance is 98.90%) or an alloy including at least one of these kinds of metal can be used. Above all, from the viewpoint of high heat reflectance, copper, silver, gold, chrome, nickel, aluminum, iridium, or lead is preferably used. From the viewpoint of excellent chemical stability, gold is preferably used.

The lid body 222 may be formed of one kind of metal or alloy or may be formed by laminating two or more kinds of metal or alloys.

A metal film is preferably provided on the outer surface of the lid body 222. Consequently, even if the heat reflectance of a base material of the lid body 222 is not high, it is possible to set the reflectance of a part where the metal film is provided to the electromagnetic wave having the wavelength of 4 μm to be equal to or higher than 75%. Further, it is possible to improve the heat reflectance of the lid body 222 while using, for the base material of the lid body 222, a material suitable for joining with the base 221 and excellent in mechanical strength.

As a material used for the metal film, among the metal materials explained above, from the viewpoint of high heat reflectance, copper, silver, gold, chrome, nickel, aluminum, iridium, or lead is preferably used. From the view point of excellent chemical stability, gold is preferably used.

A method of forming the metal film is not particularly limited. For example, vapor phase film forming methods such as vapor deposition and sputtering can be used. The metal film only has to be provided in a part where heat radiated from the second unit 3 or the package 5 reaches. The metal film does not always have to be provided in the entire region of the outer surface of the lid body 222.

When a portion other than the window section 23 of the lid body 222 is formed of a material having transparency to the excitation light, the portion other than the window section 23 of the lid body 222 and the window section 23 can be integrally formed. When the portion other than the window section 23 of the lid body 222 is formed of a material not having transparency to the excitation light, the portion other than the window section 23 of the lid body 222 and the window section 23 only have to be formed of separate bodies and joined by a publicly-known joining method.

The base 221 and the lid body 222 are preferably hermetically jointed. That is, the inside of the first package 22 is preferably an airtight space. Consequently, it is possible to set the inside of the first package 22 in a decompressed state (a state in which the inside of the first package 22 is decompressed to pressure lower than the atmospheric pressure) or an inert gas encapsulated state. As a result, it is possible to improve characteristics of the atomic oscillator 1.

A method of joining the base 221 and the lid body 222 is not particularly limited. For example, brazing, seam welding, energy beam welding (laser welding, electron beam welding, etc.), and the like can be used.

A joining member for joining the base 221 and the lid body 222 may be interposed between the base 221 and the lid body 222.

A component other than the light emitting section 21 may be housed in the first package 22.

For example, a temperature control element configured to control the temperature of the light emitting section 21, a temperature sensor, or the like may be housed in the first package 22. Examples of the temperature control element include a heat generating resistor (a heater) and a Peltier element.

With the first package 22 including the base 221 and the lid body 222, it is possible to house the light emitting section 21 in the first package 22 while allowing emission of the excitation light from the light emitting section 21 to the outside of the first package 22.

The first package 22 is held by the package 5 such that the base 221 is arranged on the opposite side of the second package 36.

Second Unit

As explained above, the second unit 3 (the second electronic component) includes the gas cell 31, the light detecting section 32, the heater 33, the temperature sensor 34, the coil 35, and the second package 36 configured to house the foregoing.

Gas Cell

Gaseous alkali metal such as rubidium, cesium, or sodium is encapsulated in the gas cell 31.

For example, the gas cell 31 includes, although not-shown in the figure, a main body section including a columnar through-hole and a pair of window sections configured to close both openings of the through-hole. Consequently, an internal space for encapsulating the alkali metal is formed.

The window sections of the gas cell 31 have transparency to the excitation light emitted from the light emitting section 21. The excitation light made incident in the gas cell 31 is transmitted through one window section. The excitation light emitted from the gas cell 31 is transmitted through the other window section.

Therefore, a material forming the window sections of the gas cell 31 is not particularly limited as long as the material has transparency to the excitation light. Examples of the material include a glass material and quartz.

A material forming the main body section of the gas cell 31 is not particularly limited and may be a metal material, a resin material, or the like or, like the window sections, may be a glass material, quartz, or the like.

The window sections are hermetically joined to the main body section. Consequently, it is possible to form the internal space of the gas cell 31 as an airtight space.

A method of joining the main body section and the window sections of the gas cell 31 is determined according to the constituent materials and is not particularly limited. For example, a joining method by an adhesive, a direct joining method, and an anode joining method can be used.

The gas cell 31 is subjected to temperature control to temperature (a second temperature) different from the temperature of the light emitting section 21, for example, about 70° C. by the heater 33.

That is, the second unit 3 is subjected to temperature control at temperature higher than the temperature of the first unit 2. In this case, a problem due to transfer of heat by radiation between the package 5 and the first and second units 2 and 3 and between the first unit 2 and the second unit 3 becomes conspicuous. Therefore, in this case, an effect by the application of the invention conspicuously appears.

Light Detecting Section

The light detecting section 32 has a function of detecting intensity of the excitation light LL (the resonance lights 1 and 2) transmitted through the gas cell 31.

The light detecting section 32 is not particularly limited as long as the light detecting section 32 can detect the excitation light. For example, photodetectors (light receiving elements) such as a solar cell and a photodiode can be used.

Heater

The heater 33 has a function of heating the gas cell 31 (more specifically, the alkali metal in the gas cell 31). Consequently, it is possible to maintain the alkali metal in the gas cell 31 gaseous.

The heater 33 generates heat through energization. The heater 33 is configured by, for example, a heat generating resistor provided on the outer surface of the gas cell 31. The heat generating resistor is formed using, for example, a chemical vapor deposition method (CVD) such as a plasma CVD or a thermal CVD, a dry plating method such as vacuum deposition, or a sol-gel method.

When the heat generating resistor is provided in an incident section or an emission section of the excitation light in the gas cell 31, the heat generating resistor is formed of a material having transparency to the excitation light, specifically, for example, a transparent electrode material such as an oxide such as ITO (Indium Tin Oxide), IZO (Indium Zinc Oxide), $In_3O_3$, $SnO_2$, $SnO_2$ containing Sb, or ZnO containing Al.

The heater 33 is not particularly limited as long as the heater 33 can heat the gas cell 31 and may be in non-contact with the gas cell 31. A Peltier element may be used instead of the heater 33 or together with the heater 33 to heat the gas cell 31.

The heater 33 is electrically connected to a below-mentioned temperature control section 72 of the control section 7 and energized.

Temperature Sensor

The temperature sensor 34 detects the temperature of the heater 33 or the gas cell 31. A heat value of the heater 33 is controlled on the basis of a detection result of the temperature sensor 34. Consequently, it is possible to maintain the alkali metal atoms in the gas cell 31 at a desired temperature.

A setting position of the temperature sensor 34 is not particularly limited and may be, for example, on the heater 33 or on the outer surface of the gas cell 31.

The temperature sensor 34 is not particularly limited. Various temperature sensors such as a thermistor and a thermocouple can be used.

The temperature sensor 34 is electrically connected to the temperature control section 72 of the control section 7, which will be described later, via a not-shown wire.

Coil

The coil 35 has a function of generating a magnetic field through energization. Consequently, by applying the magnetic field to the alkali metal in the gas cell 31, it is possible to expand, through Zeeman splitting, a gap between energy levels in which the alkali metal is degenerated and improve resolution. As a result, it is possible to improve accuracy of an oscillation frequency of the atomic oscillator 1.

The magnetic field generated by the coil 35 may be a direct-current magnetic field or an alternating-current magnetic field or may be a magnetic field obtained by superimposing the direct-current magnetic field and the alternating-current magnetic field.

A setting position of the coil 35 is not particularly limited. Although not shown in the figure, for example, the coil 35 may be provided to be wound along the outer circumference of the gas cell 31 to configure a solenoid type or a pair of coils may be set opposed to each other via the gas cell 31 to configure a Helmholtz type.

The coil 35 is electrically connected to a below-mentioned magnetic-field control section 73 of the control section 7 via a not-shown wire. Consequently, energization to the coil 35 can be performed.

A constituent material of the coil 35 is not particularly limited. Examples of the constituent material include silver, copper, palladium, platinum, gold or an alloy of the foregoing. One or two or more kinds of the metal can be used in combination.

Second Package (Light Detection Side Package)

The second package 36 houses the gas cell 31, the light detecting section 32, the heater 33, the temperature sensor 34, and the coil 35.

The second package 36 is configured the same as the first package 22 of the first unit 2.

Specifically, the second package 36 includes, as shown in FIG. 5, a base 361 (a light detection side base) and a lid body 362 (a light detection side lid body).

The base 361 directly or indirectly supports the gas cell 31, the light detecting section 32, the heater 33, the temperature sensor 34, and the coil 361. In this embodiment, the base 361 is formed in a tabular shape and is formed in a circular shape in plan view.

On one surface (a mounting surface) of the base 361, the gas cell 31, the light detecting section 32, the heater 33, the temperature sensor 34, and the coil 35 (a plurality of mounted components) are set (mounted). On the other surface of the base 361, as shown in FIG. 5, a plurality of terminals 363 (leads) project in the +X-direction. The plurality of terminals 363 are electrically connected to the light detecting section 32, the heater 33, the temperature sensor 34, and the coil 35 via a not-shown wire.

As shown in FIG. 5, the plurality of terminals 363 extend in the X-axis direction and are arranged in one direction (in this embodiment, the Y-axis direction) to be parallel to one another.

A constituent material of the base 361 is not particularly limited. For example, a ceramics material, a metal material, and a resin material can be used. However, the metal material is preferably used. Consequently, when the lid body 362 is formed of the metal material, the base 361 and the lid body 362 can be relatively easily and surely hermetically joined by welding.

The lid body 362 configured to cover the gas cell 31, the light detecting section 32, the heater 33, the temperature sensor 34, and the coil 35 on the base 361 is joined to the base 361.

The lid body 362 is formed in a bottomed tubular shape opening at one end. In this embodiment, a tubular section of the lid body 362 is formed in a cylindrical shape. The opening at one end of the lid body 362 is closed by the base 361.

The window section 37 is provided at the other end of the lid body 362, that is, in the bottom on the opposite side of the opening of the lid body 362.

The window section 37 is provided on the optical path "a" between the gas cell 31 and the light emitting section 21. The window section 37 has transparency to the excitation light. In this embodiment, the window section 37 is configured by a tabular member having optical transparency.

The window section 37 is not limited to the tabular member having optical transparency as long as the window section 37 has transparency to the excitation light. The window section 37 may be an optical component such as a lens, a polarizing plate, or a λ/4 wave plate.

The reflectance of the outer surface (a portion excluding the window section 37) of the lid body 362 to the electromagnetic wave having the wavelength of 4 μm (i.e., the far-infrared ray) is equal to or higher than 50%. Consequently, heat radiated from the package 5 is reflected on the outer surface of the lid body 362 (the outer surface of the second electronic component). Therefore, even if a reduction in the size of the package 5 is realized, it is possible to suppress transfer of heat from the outside of the package 5 to the lid body 362.

Heat radiated from the first unit 2 is reflected on the outer surface of the lid body 362. Therefore, even if the distance between the first unit 2 and the second unit 3 is reduced, it is possible to suppress transfer of heat from the first unit 2 to the second unit 3.

Consequently, it is possible to highly accurately subject an internal space S2 (see FIG. 6) of the second package 36 to temperature control.

In particular, as explained above, the heat reflectance of the outer surface of the lid body 222 of the first unit 2 is also improved. Therefore, it is possible to more effectively suppress transfer of heat by radiation between the first unit 2 and the second unit 3.

The effect explained above is improved as the heat reflectance of the outer surface of the lid body 362 is higher. Therefore, the heat reflectance is preferably equal to or higher than 75%, more preferably equal to or higher than 90%, and most preferably equal to or higher than 95%.

A constituent material of a portion other than the window section 37 of the lid body 362 is not particularly limited. For example, a ceramics material, a metal material, and a resin material can be used. However, the metal material is preferably used. Consequently, it is possible to set the heat reflectance of the outer surface of the lid body 362 to be equal to or higher than 75%. When the base 361 is formed of the metal material, the base 361 and the lid body 362 are relatively easily and surely hermetically joined by welding.

The metal material forming the lid body 362 is not particularly limited. For example, metal such as copper (heat reflectance is 97.93%), silver (heat reflectance is 98.47%), gold (heat reflectance is 98.62%), titanium (heat reflectance is 78.04%), chrome (heat reflectance is 93.77%), iron (heat reflectance is 87.09%), cobalt (heat reflectance is 87.75%), nickel (heat reflectance is 92.38%), aluminum (heat reflectance is 99.03%), iridium (heat reflectance is 98.73%), and lead (heat reflectance is 98.90%) or an alloy including at least one of these kinds of metal can be used. Above all, from the viewpoint of high heat reflectance, copper, silver, gold, chrome, nickel, aluminum, iridium, or lead is preferably used. From the viewpoint of excellent chemical stability, gold is preferably used.

The lid body 362 may be formed of one kind of metal or alloy or may be formed by laminating two or more kinds of metal or alloys.

A metal film is preferably provided on the outer surface of the lid body 362. Consequently, even if the heat reflectance of a base material of the lid body 362 is not high, it is possible to set the reflectance of a part where the metal film is provided to the electromagnetic wave having the wavelength of 4 μm to be equal to or higher than 75%. Further, it is possible to improve the heat reflectance of the lid body 362 while using, for the base material of the lid body 362, a material suitable for joining with the base 361 and excellent in mechanical strength.

As a material used for the metal film, among the metal materials explained above, from the viewpoint of high heat reflectance, copper, silver, gold, chrome, nickel, aluminum, iridium, or lead is preferable used. From the view point of excellent chemical stability, gold is preferably used.

A method of forming the metal film is not particularly limited. For example, vapor phase film forming methods such as vapor deposition and sputtering can be used. The metal film only has to be provided in a part where heat radiated from the first unit 2 or the package 5 reaches. The metal film does not always have to be provided in the entire region of the outer surface of the lid body 362.

A constituent material of the portion other than the window section 37 of the lid body 362 is not particularly limited. For example, ceramics, metal, and resin can be used.

When the portion other than the window section 37 of the lid body 362 is formed of a material having transparency to the excitation light, the portion other than the window section 37 of the lid body 362 and the window section 37 can be integrally formed. When the portion other than the window section 37 of the lid body 362 is formed of a material not having transparency to the excitation light, the portion other than the window section 37 of the lid body 362 and the window section 37 only have to be formed of separate bodies and joined by a publicly-known joining method.

The base 361 and the lid body 362 are preferably hermetically jointed. That is, the inside of the second package 36 is preferably an airtight space. Consequently, it is possible to set the inside of the second package 36 in a decompressed state (a state in which the inside of the second package 36 is decompressed to pressure lower than the atmospheric pressure) or an inert gas encapsulated state. As a result, it is possible to improve the characteristics of the atomic oscillator 1.

A method of joining the base 361 and the lid body 362 is not particularly limited. For example, brazing, seam welding, energy beam welding (laser welding, electron beam welding, etc.), and the like can be used.

A joining member for joining the base 361 and the lid body 362 may be interposed between the base 361 and the lid body 362.

At least the gas cell 31 and the light detecting section 32 only have to be housed in the second package 36. Components other than the gas cell 31, the light detecting section 32, the heater 33, the temperature sensor 34, and the coil 35 may be housed in the second package 36.

With the second package 36 including the base 361 and the lid body 362, it is possible to house the gas cell 31 and the light detecting section 32 in the second package 36 while allowing incidence of the excitation light from the light emitting section 21 in the second package 36. Therefore, by using the second package 36 in combination of the first package 22, it is possible to house the light emitting section 21 and the gas cell 31 in separate packages, which are in non-contact with each other, while securing an optical path of the excitation light from the light emitting section 21 to the light detecting section 32 via the gas cell 31.

The second package 36 is held in the package 5 such that the base 361 is arranged on the opposite side of the first package 22.

Package

The package 5 has a function of housing the first package 22 and the second package 36.

The package 5 includes an internal space S in which the first unit 2 and the second unit 3 are housed in a state in which the first unit 2 and the second unit 3 are separated from each other. The internal space S is decompressed to pressure lower than the atmospheric pressure. Consequently, it is possible to suppress heat conduction and transfer of heat by convection between the package 5 and the first and second units 2 and 3 and between the first unit 2 and the second unit 3.

More specifically, as shown in FIG. 5, the package 5 includes a main body 50 including a recess 51 opening on the upper side and a lid body 54 configured to close the recess 51.

The first package 22 and the second package 36 are set in the recess 51 of the main body 50.

The recess 51 is formed in a shape for regulating the positions and the postures of the first package 22 and the second package 36. Consequently, by setting the first package 22 and the second package 36 in the recess 51 of the package 5, it is possible to perform positioning of an optical system including the light emitting section 21 and the light detecting section 32. Therefore, it is possible to make it easy to set the first package 22 and the second package 36 with respect to the package 5.

The recess 51 extends in the X-axis direction. The first package 22 is arranged on one end side (the left side in FIG. 5) of the recess 51. The second package 36 is arranged on the other end side (the right side in FIG. 5) of the recess 51.

The first package 22 and the second package 36 are arranged such that the axes of the lid body 222 and the lid body 362 formed in the tubular shape are parallel to the extending direction of the recess 51 (the X-axis direction). Consequently, the first package 22 and the second package 36 are arranged such that the axes of the lid body 222 and the lid body 362 coincide with each other or are parallel to each other.

In this embodiment, the cross section of the recess 51 is formed in a rectangular shape.

A support section 52 (a first support section) configured to support the base 221 of the first package 22 is provided on one end side (the left side in FIG. 5) of the main body 50. A support section 53 (a second support section) configured to support the base 361 of the second package 36 is provided on the other end side (the right side in FIG. 5) of the main body 50.

As explained above, the support section 52 supports the base 221 and the support section 53 opposed to the support section 52 supports the base 361. Consequently, it is possible to increase the distance between a contact section of the first package 22 and the package 5 and a contact section of the second package 36 and the package 5. Therefore, it is possible to more effectively suppress heat conduction via the package 5 between the first package 22 and the second package 36.

The lid body 222 and the lid body 362 are in non-contact with the package 5. Consequently, it is possible to more effectively suppress the heat conduction via the package 5 between the first package 22 and the second package 36. In particular, whereas the cross section of the recess 51 is formed in the rectangular shape, the tubular sections of the lid bodies 222 and 362 are respectively formed in the cylindrical shapes. Therefore, it is possible to form relatively large gaps between the side surfaces of the lid bodies 222 and 362 and the package 5. As a result, it is possible to suppress heat conduction from the lid bodies 222 and 362 to the package 5 to be extremely small. Even if the side surfaces of the lid bodies 222 and 362 and the package 5 are in contact with each other, it is possible to reduce a contact area of the side surfaces and the package 5.

The support section 52 includes a setting surface parallel to the Y axis and the Z axis. A surface of the base 221 of the first package 22 on the opposite side of the lid body 222 is in contact with or close to the setting surface. Consequently, it is possible to regulate the position and the posture of the first package 22 with respect to the package 5. For example, the base 221 can be fixed to the support section 52 using an adhesive.

In the support section 52, a plurality of through-holes 521, through which the plurality of terminals 223 of the first package 22 are inserted, are formed. That is, the support section 52 is formed in a shape like a socket to which the first package 22 is attached. Consequently, it is also possible to regulate the position and the posture of the first package 22 with respect to the package 5. For example, the plurality of terminals 223 can be fixed to the support section 52 by solder.

The plurality of terminals 223 pierce through the plurality of through-holes 521. Consequently, the distal ends of the terminals 223 project from the package 5.

The plurality of through-holes 521 are provided to correspond to the plurality of terminals 223. The plurality of through-holes 521 extend in the X-axis direction and are arranged in the Y-axis direction. Therefore, portions of the plurality of terminals 223 projecting from the package 5 are also arranged in the Y-axis direction.

Similarly, the support section 53 includes a setting surface parallel to the Y axis and the Z axis. A surface of the base 361 of the second package 36 on the opposite side of the lid body 362 is in contact with or close to the setting surface. Consequently, it is possible to regulate the position and the posture of the second package 36 with respect to the package 5. For example, the base 361 can be fixed to the support section 53 using an adhesive.

In the support section 53, a plurality of through-holes 531, through which the plurality of terminals 363 of the second package 36 are inserted, are formed. That is, the support section 53 is formed in a shape like a socket to which the second package 36 is attached. Consequently, it is also possible to regulate the position and the posture of the second package 36 with respect to the package 5. For example, the plurality of terminals 363 can be fixed to the support section 53 by solder.

The plurality of terminals 363 pierce through the plurality of through-holes 531. Consequently, the distal ends of the terminals 363 project from the package 5.

The plurality of through-holes 531 are provided to correspond to the plurality of terminals 363. The plurality of through-holes 531 extend in the X-axis direction and are arranged in the Y-axis direction. Therefore, portions of the plurality of terminals 363 projecting from the package 5 are also arranged in the Y-axis direction.

The lid body 54 configured to close the opening of the recess 51 is joined to the main body 50. The lid body 54 is formed in a flat plate shape.

The main body 50 and the lid body 54 are preferably hermetically joined. That is, the inside of the package 5 is preferably an airtight space. Consequently, it is possible to set the inside of the package 5 in a decompressed state (a state in which the inside of the package 5 is decompressed to pressure lower than the atmospheric pressure) or an inert gas encapsulated state.

A method of joining the main body 50 and the lid body 54 is not particularly limited. For example, brazing, seam welding, energy beam welding (laser welding, electron beam welding, etc.), and the like can be used.

A constituent material of the main body 50 and the lid body 54 of the package 5 is not particularly limited. Examples of the constituent material include a metal material, a resin material, and a ceramics material. However, the constituent material is preferably a nonmetal material such as a resin material or a ceramics material.

Consequently, it is possible to reduce the heat conduction via the package 5 between the first package 22 and the second package 36. As a result, it is possible to effectively prevent or suppress thermal interference between the light emitting section 21 and the gas cell 31.

The resin material forming the package 5 is not particularly limited. Examples of the resin material include polyethylene, polyolefin such as an ethylene-vinyl acetate copolymer (EVA), acrylic resin, an acrylonitrile-butadiene-styrene copolymer (ABS resin), an acrylonitrile-styrene copolymer (AS resin), polyethylene terephthalate (PET), polyether, polyether ketone (PEK), polyether ether ketone (PEEK), styrene-based, polyolefin-based, polyvinyl chloride-based, polyurethane-based, polyester-based, polyamide-based, polybutadiene-based, trans-polyisoprene-based, fluoro rubber-based, and chlorinated polyethylene-based thermoplastic elastomers, epoxy resin, phenol resin, urea resin, melamine resin, unsaturated polyester, silicon resin, polyurethane, and the like, and a copolymer, a blend, and polymer alloy mainly containing these kinds of resin. One kind or two kinds among these kinds of resin can be used in combination (e.g., as a laminated body formed by two or more layers).

The ceramics material forming the package 5 is not particularly limited. Examples of the ceramics material include various kinds of glass, oxide ceramics such as alumina, silica, titania, zirconia, yttria, and calcium phosphate, nitride ceramics such as silicon nitride, aluminum nitride, titanium nitride, and boron nitride, carbonate ceramics such as graphite and tungsten carbide, and ferroelectric materials such as barium titanate, strontium titanate, PZT, PLZT, and PLLZT.

The thermal conductivity of the package 5 is preferably equal to or higher than $0.1\ \text{W}\cdot\text{m}^{-1}\cdot\text{K}^{-1}$ and equal to or lower than $40\ \text{W}\cdot\text{m}^{-1}\cdot\text{K}^{-1}$ and more preferably equal to or higher than $0.1\ \text{W}\cdot\text{m}^{-1}\cdot\text{K}^{-1}$ and equal to or lower than $0.5\ \text{W}\cdot\text{m}^{-1}\cdot\text{K}^{-1}$. Consequently, it is possible to more effectively suppress the heat conduction via the package 5 between the first package 22 and the second package 36. That is, it is possible to more conspicuously show an effect of improving the thermal insulation of the package 5 and thermally separating the first package 22 and the second package 36.

On the other hand, when the thermal conductivity is too low, depending on the shape, the size, and the like of the package 5, it is difficult to select a material that can secure rigidity necessary for the package 5. On the other hand, when the thermal conductivity is too high, depending on the distance between the contact section of the first package 22 and the package 5 and the contact section of the second package 36 and the package 5, it is difficult to suppress the heat conduction via the package 5 between the first package 22 and the second package 36.

In this embodiment, as shown in FIG. 6, a reflection prevention layer 55 configured to prevent reflection of heat is provided on the inner surface (the surface on the inner side) of the package 5. The reflection prevention layer 55 assumes black or a dark color. That is, the inner surface of the package 5 includes a black or dark color portion. Consequently, heat radiated from the first unit 2 and the second unit 3 is absorbed by the inner surface of the package 5. Therefore, it is possible to suppress heat radiated from one of the first unit 2 and the second unit 3 from being reflected on the inner surface of the package 5 and transferred to the other unit.

Lower heat reflectance of the reflection prevention layer 55 is better. The heat reflectance of the reflection prevention layer 55 is preferably equal to or lower than 30% and more preferably equal to or lower than 10%.

The reflection prevention layer 55 is not particularly limited as long as the reflection prevention layer 55 is excellent in heat absorption. For example, the reflection prevention layer 55 can be formed by black or dark color painting. The reflection prevention layer 55 only has to be provided in a part where heat radiated from the first unit 2 or the second unit 3 reaches. The reflection prevention layer 55 does not always have to be provided in the entire region of the inner surface of the package 5.

A reflection layer 56 having reflectivity to heat is provided on the outer surface (the surface on the outer side) of the package 5. The reflectance of the reflection layer 56 to the electromagnetic wave having the wavelength of 4 μm is equal to or higher than 50%. Consequently, heat from the outside of the package 5 is reflected on the outer surface of the package 5. Therefore, it is possible to suppress the heat from the outside of the package 5 from being transferred to the inside of the package 5.

The reflection layer 56 is preferably formed of a metal material. Consequently, it is possible to set the reflectance of the reflection layer 56 to the electromagnetic wave having the wavelength of 4 μm to be equal to or higher than 50%.

As the metal material used for the reflection layer 56, the metal material used for the lid body 222 and the lid body 362 can be used. However, from the viewpoint of excellent heat reflectivity and chemical stability, gold is preferably used.

A method of forming the reflection layer 56 is not particularly limited. For example, vapor phase film forming methods such as vapor deposition and sputtering can be used. The reflection layer 56 only has to be provided in apart where heat on the outside of the package 5 reaches. The reflection layer 56 does not always have to be provided in the entire region of the outer surface of the package 5.

The inside of the package 5 is preferably in a state in which the inside of the package 5 is decompressed to pressure lower than the atmospheric pressure or an inert gas encapsulated state. Consequently, it is possible to prevent deterioration such as oxidation of the outer surfaces of the lid body 222 of the first unit 2 and the lid body 362 of the second unit 3 and maintain the heat reflectance of the outer surfaces of the lid body 222 and the lid body 362 in a high state for a long period.
Wiring Board The wiring board 6 includes a not-shown wire and has a function of electrically connecting, via the wire, the electronic components such as the control section 7 mounted on the wiring board 6 and the plurality of terminals 223 of the first package 22 and the plurality of terminals 363 of the second package 36.

The wiring board 6 also has a function of supporting the package 5 via the plurality of terminals 223 and the plurality of terminals 363.

More specifically, in the wiring board 6, as shown in FIG. 5, a through-hole 61 piercing through the wiring board 6 in the thickness direction is formed.

The package 5 is inserted into the through-hole 61. Consequently, compared with mounting the package 5 on the surface of the wiring board 6, it is possible to realize a reduction in the height of the entire device.

In this embodiment, the through-hole 61 is formed in a shape similar to the outer shape of the package 5, that is, a square (more specifically, a rectangle with the X-axis direction set as the longitudinal direction) in plan view.

The through-hole 61 is formed larger than the outer shape of the package 5 in plan view. That is, the through-hole 61 has length larger than the length in the X-axis direction of the package 5 and has width larger than the length (the width) in the Y-axis direction of the package 5 in plan view.

Therefore, the package 5 inserted into the through-hole 61 is separated from the wiring board 6. Consequently, it is possible to suppress interference of heat between the gas cell 31, the light emitting section 21, and the light detecting section 32 held in the package 5 and the wiring board 6.

Around the through-hole 61, a plurality of terminals 62 and a plurality of terminals 63 are provided on one surface of the wiring board 6.

In this embodiment, the plurality of terminals 62 are provided near one end in the longitudinal direction of the through-hole 61. On the other hand, the plurality of terminals 63 are provided near the other end in the longitudinal direction of the through-hole 61.

The plurality of terminals 62 are provided to correspond to the plurality of terminals 223 of the first package 22. The plurality of terminals 223 corresponding to the plurality of terminals 62 are respectively joined to the plurality of terminals 62.

The plurality of terminals 63 are provided to correspond to the plurality of terminals 363 of the second package 36. The plurality of terminals 363 corresponding to the plurality of terminals 63 are respectively joined to the plurality of terminals 63.

According to the joining of the terminals, the package 5 is supported by the wiring board 6 via the plurality of terminals 223 and the plurality of terminals 363, the plurality of terminals 223 are respectively electrically connected to the plurality of terminals 62, and the plurality of terminals 363 are respectively electrically connected to the plurality of terminals 63.

The surface of the wiring board 6 is a surface parallel to the X axis and the Y axis. As explained above, the plurality of terminals 223 are arranged in the Y-axis direction. Therefore, the plurality of terminals 223 are arranged along the surface of the wiring board 6. Similarly, the plurality of terminals 363 are arranged along the surface of the wiring board 6.

Consequently, it is possible to join the wiring board 6 and the plurality of terminals 223 and 363 while reducing stress generated in the plurality of terminals 223 and 363. Therefore, it is possible to improve the reliability of the atomic oscillator 1.

As explained above, the electrical connection of the first package 22 and the wiring board 6 and the support of the package 5 on the wiring board 6 are performed via the plurality of terminals 223 piercing through the package 5. Therefore, compared with configuring a plurality of terminals of the first package 22 and a plurality of terminals of the package 5 as separate bodies, since the number of contact points of the terminals decreases, it is possible to improve the reliability of the electrical connection of the plurality of terminals 223.

A method of joining the terminals 223 and the terminals 62 and a method of joining the terminals 363 and the terminals 63 are not particularly limited as long as it is possible to join the terminals while securing electrical conduction of joining sections. Examples of the joining method include a joining method by solder and a joining method by an anisotropic conductive adhesive. When the terminals 223 and the terminals 62 are configured like crimped terminals, the terminals 223 and the terminals 62 can also be joined by crimping. Similarly, when the terminals 363 and the terminals 63 are configured like crimped terminals, the terminals 363 and the terminals 63 can also be joined by crimping.

The plurality of terminals 223 and 363 are respectively electrically connected to the control section 7 via not-shown wires.

As the wiring board 6, various printed wiring boards can be used. However, from the viewpoint of securing rigidity necessary to support the package 5, it is preferable to use a board including a rigid section, for example, a rigid board or a rigid flexible board.

Even when a wiring board not including a rigid section (e.g., a flexible board) is used as the wiring board 6, for example, by joining a reinforcing member for improving rigidity to the wiring board, it is possible to secure rigidity necessary to support the package 5.

The control section 7 is set on one surface of the wiring board 6. Electronic components other than the control section 7 may be mounted on the wiring board 6.
Control Section The control section 7 shown in FIG. 2 has a function of controlling the heater 33, the coil 35, and the light emitting section 21.

In this embodiment, the control section 7 is configured by an IC (Integrated Circuit) chip mounted on the wiring board 6.

The control section 7 includes an excitation-light control section 71 configured to control the frequencies of the resonance lights 1 and 2 of the light emitting section 21, the temperature control section 72 configured to control the temperature of the alkali metal in the gas cell 31, and the magnetic-field control section 73 configured to control a magnetic field applied to the gas cell 31.

The excitation-light control section 71 controls, on the basis of a detection result of the light detecting section 32, the frequencies of the resonance lights 1 and 2 emitted from the light emitting section 21. More specifically, the excitation-light control section 71 controls the frequencies of the resonance lights 1 and 2 emitted from the light emitting section 21 such that ($\omega 1 - \omega 2$) detected by the light detecting section 32 coincides with the frequency $\omega 0$ peculiar to the alkali metal. The excitation-light control section 71 controls the center frequencies of the resonance lights 1 and 2 emitted from the light emitting section 21.

The temperature control section 72 controls energization to the heater 33 on the basis of a detection result of the temperature sensor 34. Consequently, it is possible to maintain the gas cell 31 within a desired temperature range. The temperature sensor 34 configures a temperature detecting section configured to detect the temperature of the gas cell 31.

The magnetic-field control section 73 controls energization to the coil 35 such that the magnetic field generated by the coil 35 is fixed.

With the atomic oscillator 1 in this embodiment explained above, the internal space S of the package 5 has pressure lower than the atmospheric pressure. Therefore, it is possible to suppress heat conduction and transfer of heat by convection between the package 5 and the first and second units 2 and 3 and between the first unit 2 and the second unit 3.

Further, heat radiated from the package 5 is reflected on the outer surfaces of the first unit 2 and the second unit 3. Therefore, even if a reduction in size of the package 5 is realized, it is possible to suppress transfer of heat from the outside of the package 5 to the first unit 2 or the second unit 3.

Heat radiated from one unit of the first unit 2 and the second unit 3 is reflected by the other unit. Therefore, even if the distance between the first unit 2 and the second unit 3 is reduced, it is possible to suppress transfer of heat from the one unit to the other unit.

Consequently, in the atomic oscillator 1, it is possible to suppress temperature fluctuation of each of the two units (more specifically, the light emitting section 21 and the gas cell 31) in the package 5 while realizing a reduction in size.

2. Electronic Apparatus

The atomic oscillator explained above can be incorporated in various electronic apparatuses.

An electronic apparatus according to the invention is explained below.

Figure 7:
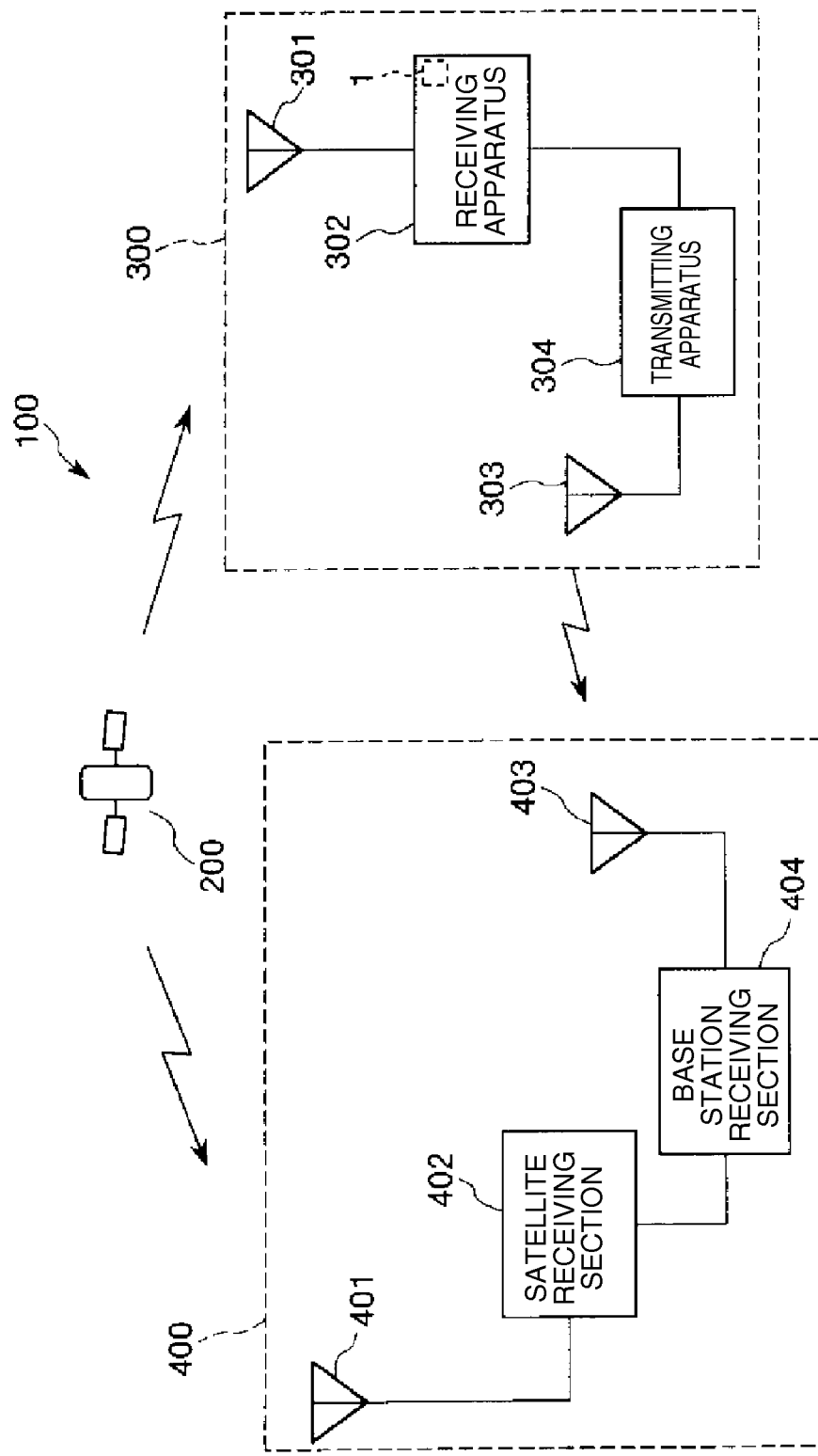
FIG. 7 is a schematic diagram of a system configuration in which the atomic oscillator according to the embodiment of the invention is used in a positioning system that makes use of a GPS satellite.

FIG. 7 is a schematic diagram of a system configuration in which the atomic oscillator according to the invention is used in a positioning system that makes use of a GPS satellite.

A positioning system 100 shown in FIG. 7 includes a GPS satellite 200, a base station apparatus 300, and a GPS receiving apparatus 400.

The GPS satellite 200 transmits positioning information (a GPS signal).

The base station apparatus 300 includes a receiving apparatus 302 configured to highly accurately receive the positioning information from the GPS satellite 200 via an antenna 301 set at, for example, an electronic reference point (a GPS continuous observation station) and a transmitting apparatus 304 configured to transmit, via an antenna 303, the positioning information received by the receiving apparatus 302.

The receiving apparatus 302 is an electronic apparatus including the atomic oscillator 1 according to the invention as a reference frequency oscillation source of the electronic apparatus. The receiving apparatus 302 has excellent reliability. The positioning information received by the receiving apparatus 302 is transmitted by the transmitting apparatus 304 on a real time basis.

The GPS receiving apparatus 400 includes a satellite receiving section 402 configured to receive the positioning information from the GPS satellite 200 via an antenna 401 and a base-station receiving section 404 configured to receive the positioning information from the base station apparatus 300 via an antenna 403.

3. Moving Object

The atomic oscillator according to the invention can be incorporated in various moving objects. A moving object including the atomic oscillator according to the invention has excellent reliability.

An example of the moving object according to the invention is explained below.

Figure 8:
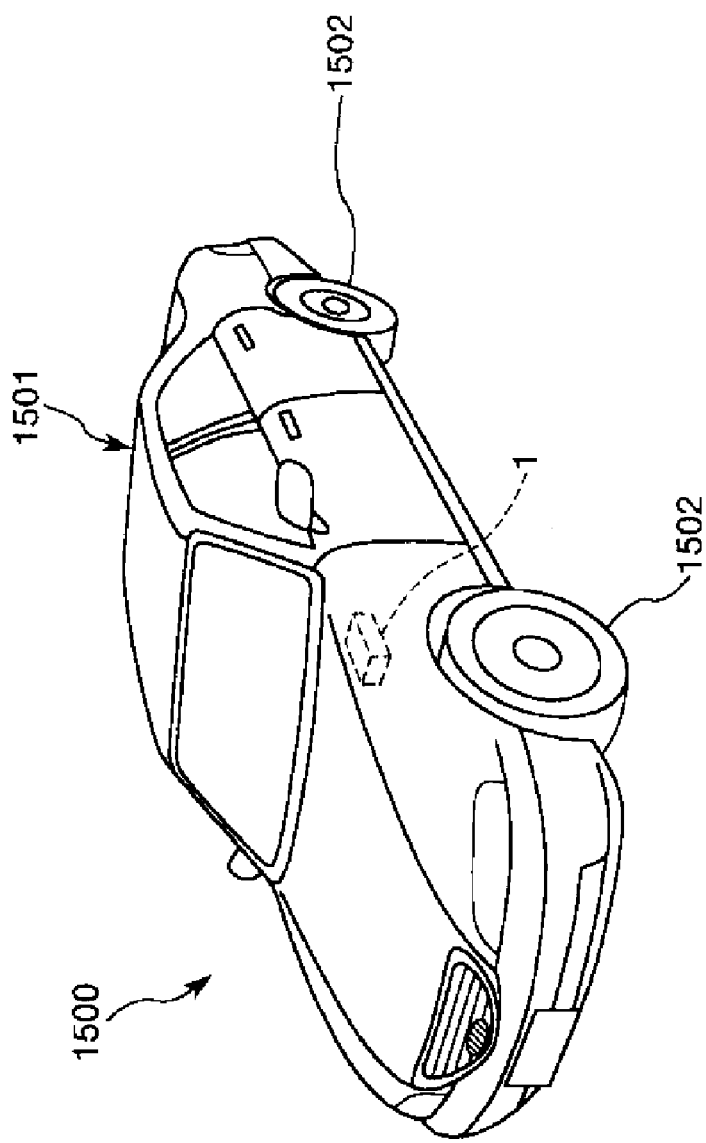
FIG. 8 is a perspective view showing the configuration of a moving object (an automobile) including the atomic oscillator according to the embodiment of the invention.

FIG. 8 is perspective view showing the configuration of a moving object (an automobile) including the atomic oscillator according to the invention.

A moving object 1500 shown in FIG. 8 includes a vehicle body 1501 and four wheels 1502. The moving object 1500 is configured to rotate the wheels 1502 with a not-shown power source (an engine) provided in the vehicle body 1501. The atomic oscillator 1 is incorporated in the moving object 1500. For example, a not-shown control section controls the driving of the power source on the basis of an oscillation signal from the atomic oscillator 1.

The electronic apparatus or the moving object according to the invention is not limited to the one explained above and can be applied to, for example, a cellular phone, a digital still camera, an inkjet discharge apparatus (e.g., an inkjet printer), a personal computer (a mobile personal computer and a laptop personal computer), a television, a video camera, a video tape recorder, a car navigation apparatus, a pager, an electronic organizer (including an electronic organizer with a communication function), an electronic dictionary, an electronic calculator, an electronic game machine, a word processor, a work station, a videophone, a television monitor for crime prevention, electronic binoculars, a POS terminal, medical equipment (e.g., an electronic thermometer, a blood pressure manometer, a blood sugar meter, an electrocardiogram measuring apparatus, an ultrasonic diagnostic apparatus, and an electronic endoscope), a fish finder, measurement instruments, meters (e.g., meters of a vehicle, an airplane, and a ship), and a flight simulator.

The electronic device, the quantum interference device, the atomic oscillator, the electronic apparatus, and the moving object according to the invention are explained with reference to the embodiment shown in the drawings. However, the invention is not limited to the foregoing.

Components of sections in the invention can be replaced with arbitrary components that display functions same as the functions of the components in the embodiment. Arbitrary components can be added.

In the invention, arbitrary components of the embodiment may be combined.

In the embodiment explained above, the electronic device according to the invention is applied to the quantum interference device. However, the electronic device according to the invention is not limited to this and can be applied to electronic devices in which two electronic components (a first electronic component and a second electronic component) subjected to temperature control at temperatures different from each other are housed in one package. That is, as the first electronic component and the second electronic component, various electronic components can be used as long as the electronic components have temperature characteristics and operating temperatures different from each other.

The entire disclosure of Japanese Patent Application No. 2013-066357, filed Mar. 27, 2013 is expressly incorporated by reference herein.

What is claimed is:

1. An electronic device comprising:
   a first electronic component, the first electronic component includes:
   a light emitter that emits first and second lights having different frequencies from each other; and
   a first component package that houses the light emitter;
   a second electronic component, the second electronic component includes:
   a gas cell that encapsulates alkali metal atoms and that receive the first and second lights;
   a light detector that detects intensity of an excitation light from the gas cell in accordance with the first and second lights and that outputs a detection result;
   a heater that heats the gas cell;
   an excitation-light controller that receives the detection result and that sends a control signal to the light emitter based on the detection result so as to change a frequency of the first and second lights; and
   a second component package that houses the gas cell, the light detector, the heater and the excitation-light controller; and
   a main package that houses the first and second component packages, the first and second component packages being spaced apart from each other with an internal space, the internal space being decompressed to pressure lower than the atmospheric pressure, wherein
   reflectance of at least a part of an outer surface of at least one electronic component of the first electronic component and the second electronic component to an electromagnetic wave having a wavelength of 4 µm is equal to or higher than 50%.

2. The electronic device according to claim 1, wherein the first electronic component is subjected to temperature control at a first temperature by the heater, and
   the second electronic component is subjected to temperature control at a second temperature higher than the first temperature by the heater.

3. The electronic device according to claim 1, wherein an inner surface of the package includes a black or dark color portion.

4. The electronic device according to claim 1, wherein reflectance of at least a part of an outer surface of the package to the electromagnetic wave having the wavelength of 4 µm is equal to or higher than 50%.

5. The electronic device according to claim 1, wherein reflectance of at least a part of an outer surface of each of the first electronic component and the second electronic component to the electromagnetic wave having the wavelength of 4 µm is equal to or higher than 50%.

6. The electronic device according to claim 1, wherein a metal film is arranged on the outer surface of at least one electronic component of the first electronic component and the second electronic component.

7. An atomic oscillator comprising the electronic device according to claim 1.

8. An electronic apparatus comprising the electronic device according to claim 1.

9. A moving object comprising the electronic device according to claim 1.

* * * * *